(12) United States Patent
Hirose et al.

(10) Patent No.: US 11,542,157 B2
(45) Date of Patent: Jan. 3, 2023

(54) MICROCHIP

(71) Applicant: Ushio Denki Kabushiki Kaisha, Tokyo (JP)

(72) Inventors: Kenichi Hirose, Tokyo (JP); Makoto Yamanaka, Tokyo (JP); Shinji Suzuki, Tokyo (JP); Kenji Hatakeyama, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 344 days.

(21) Appl. No.: 16/758,362

(22) PCT Filed: Aug. 7, 2018

(86) PCT No.: PCT/JP2018/029538
§ 371 (c)(1),
(2) Date: Apr. 22, 2020

(87) PCT Pub. No.: WO2019/082471
PCT Pub. Date: May 2, 2019

(65) Prior Publication Data
US 2020/0255288 A1 Aug. 13, 2020

(30) Foreign Application Priority Data
Oct. 27, 2017 (JP) .............................. JP2017-207839

(51) Int. Cl.
*B81C 3/00* (2006.01)
*B81C 1/00* (2006.01)

(52) U.S. Cl.
CPC .......... *B81C 3/001* (2013.01); *B81C 1/00071* (2013.01); *B81C 2201/019* (2013.01)

(58) Field of Classification Search
CPC ................ B81C 3/001; B81C 1/00071; B81C 2201/019; B01L 2200/12;
(Continued)

(56) References Cited

U.S. PATENT DOCUMENTS 6,176,962 B1 * 1/2001 Soane ................ B01F 33/3031
204/600
2004/0211511 A1 10/2004 Suzuki
(Continued)

FOREIGN PATENT DOCUMENTS

JP 3714338 B2 11/2005
JP 2006-187730 A 7/2006
(Continued)

OTHER PUBLICATIONS

International Search Report issued in PCT/JP2018/029538; dated Oct. 9, 2018.
(Continued)

*Primary Examiner* — Yasser A Abdelaziez
(74) *Attorney, Agent, or Firm* — Studebaker & Brackett PC (57) ABSTRACT

Provided is a microchip that can achieve a favorable bonding state in the bonding portion between first and second substrates even if the microchip is large in size.

A microchip includes a first substrate made of a resin and a second substrate made of a resin, the first substrate and the second substrates being bonded to each other, and a channel surrounded by a bonding portion between the first substrate and the second substrate is formed by a channel forming step formed at least in the first substrate. Further, a noncontact portion is formed to surround the bonding portion, and an angle $\theta_1$ formed between a side wall surface of the channel forming step and a bonding surface continuous therewith satisfies $\theta_1 > 90°$.

4 Claims, 6 Drawing Sheets

(58) Field of Classification Search
CPC ....... B01L 2300/0858; B01L 3/502707; G01N 35/08; G01N 37/00
See application file for complete search history.

(56) References Cited

U.S. PATENT DOCUMENTS

| | | | | |
|---|---|---|---|---|
| 2005/0175883 | A1* | 8/2005 | Trabold | H01M 8/04156 429/512 |
| 2009/0202391 | A1* | 8/2009 | Hagiwara | F04B 43/043 422/68.1 |
| 2014/0027054 | A1 | 1/2014 | Yoshihara et al. | |
| 2015/0086446 | A1* | 3/2015 | Saito | C09J 5/00 156/60 |

FOREIGN PATENT DOCUMENTS

| | | |
|---|---|---|
| JP | 2008-019348 A | 1/2008 |
| JP | 2008-518225 A | 5/2008 |
| JP | 2011-161578 A | 8/2011 |
| JP | 5152361 B2 | 2/2013 |
| JP | 2014-122831 A | 7/2014 |
| WO | 03/055790 A1 | 7/2003 |
| WO | 2006/046164 A1 | 5/2006 |
| WO | 2008/087800 A1 | 7/2008 |

OTHER PUBLICATIONS

Written Opinion issued in PCT/JP2007/072927; dated Jan. 8, 2008.
An Office Action; "Notice of Reasons for Refusal", mailed by the Japanese Patent Office dated Feb. 2, 2021, which corresponds to Japanese Patent Application No. 2017-207839 and is related to U.S. Appl. No. 16/758,362; with English language translation.
The extended European search report issued by the European Patent Office dated Nov. 19, 2020, which corresponds to European Patent Application No. 18871454.7-1101 and is related to U.S. Appl. No. 16/758,362.

* cited by examiner

MICROCHIP

TECHNICAL FIELD

The present invention relates to a microchip formed by bonding a first substrate and a second substrate each made of a resin.

BACKGROUND ART

In the field of biochemistry, techniques for separating, synthesizing, extracting, or analyzing a small amount of reagent by using a microreactor have been attracting attention in recent years. The microreactor includes, for example, a microchip that is a small substrate made of silicon, a silicone resin, glass, or the like on which microscale analysis channels and the like are formed by semiconductor microfabrication techniques.

A reaction analysis system using such a microreactor is referred to as a micro total analysis system (hereinafter, referred to as a "μTAS"). According to this μTAS, high-speed high-precision reaction analysis can be performed since the ratio of the surface area to volume of the reagent increases. In addition, a compact automated system can be constructed.

Microchips suited for various applications can be fabricated by providing functional regions having various functions, such as a reaction region where a reagent is located, in channels called microchannels. Examples of the applications of the microchips include analyses in chemical, biochemical, pharmaceutical, medical and veterinary fields, such as genetic analysis, clinical diagnosis and drug screening, synthesis of chemical compounds and environmental measurement.

Such microchips typically have a structure that a pair of substrates are opposed and bonded to each other. Fine channels, for example, having a width of about 10 to several hundreds of micrometers and a depth of about 10 to several hundreds of micrometers are then formed in the front surface of at least either one of the substrates. For the substrates, glass substrates are mainly used because of easy fabrication and optical detection capabilities. Microchips made of resin substrates that are light-weighted, less breakable and inexpensive compared to glass substrates have been under development recently.

Figure 10A:
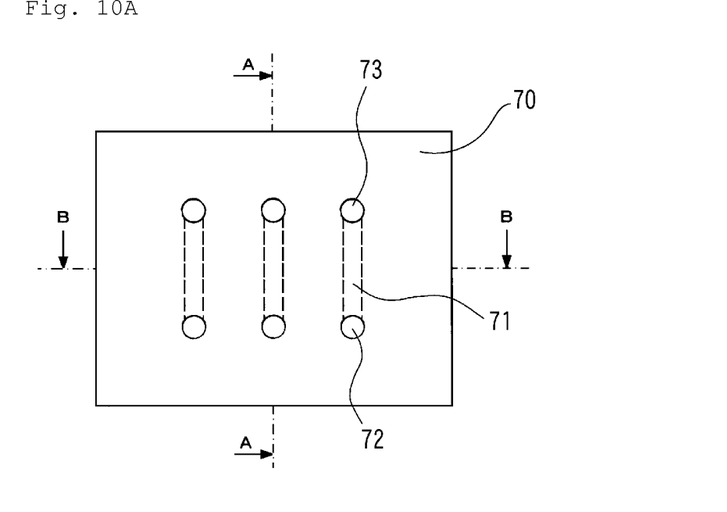
FIG. 10A is a plan view illustrating a configuration according to an example of a conventional microchip.
Figure 10B:
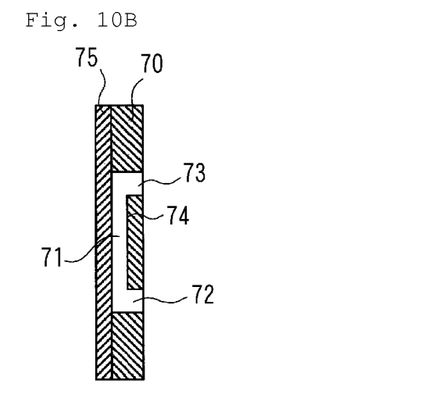
FIG. 10B is a cross-sectional end view taken along line A-A of FIG. 10A.
Figure 10C:
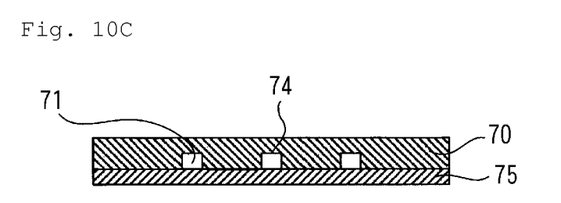
FIG. 10C is a cross-sectional end view taken along line B-B of FIG. 10A.

FIG. 10A is a plan view illustrating a configuration according to an example of a conventional microchip. FIG. 10B is a cross-sectional end view taken along line A-A of FIG. 10A. FIG. 10C is a cross-sectional end view taken along line B-B of FIG. 10A. This microchip includes a first substrate 70 having injection ports 72 into which samples are injected and discharge ports 73 from which the samples are discharged, and a second substrate 75. Channel forming steps 74 for forming channels 71 connecting the injection ports 72 to the discharge ports 73 are formed in the front surface of the first substrate 70. On the other hand, the second substrate 75 is a plate-shaped one having a flat front surface.

The first substrate 70 and the second substrate 75 are then bonded with their front surfaces in close contact with each other, whereby a microchip including the channels 71 surrounded by the bonding portion between the first substrate 70 and the second substrate 75 is obtained.

As a method for bonding the first substrate and the second substrate in manufacturing such a microchip, there have been proposed methods including performing an activation treatment on the front surfaces of the respective first and second substrates 70 and 75 to be bonding surfaces, and then stacking the first substrate 70 and the second substrate 75 with their front surfaces in close contact with each other (for example, see Patent Literatures 1 to 5).

In such microchip manufacturing methods, a vacuum ultraviolet irradiation treatment of irradiating the front surfaces with vacuum ultraviolet rays or a plasma treatment of bringing the front surfaces into contact with atmospheric pressure plasma can be used as the activation treatment on the front surfaces of the respective first and second substrates 70 and 75.

After the first substrate 70 and the second substrate 75 are stacked, either one or both of a heating treatment and a pressure treatment are performed.

CITATION LIST

Patent Literature

Patent Literature 1: Japanese Patent No. 3714338
Patent Literature 2: Japanese Patent Application Laid-Open No. 2006-187730
Patent Literature 3: Japanese Patent Application Laid-Open No. 2008-19348
Patent Literature 4: International Publication No. 2008/087800
Patent Literature 5: Japanese Patent No. 5152361

SUMMARY OF INVENTION

Technical Problem

However, the foregoing microchip has been found to have the following problems.

If a large-sized microchip of not less than 25 mm in length and not less than 25 mm in width (such as 25 mm in length×70 mm in width, and 85 mm in length×128 mm in width) is manufactured, the used first and second substrates 70 and 75 are likely to warp because of the large area. In addition, the bonding surfaces of the first and second substrates 70 and 75 are likely to be undulated in the pressure treatment and/or the heating treatment. A favorable bonding state is thus not obtained in the bonding portion of the resulting microchip, which results in a problem of leakage of the samples from the channels 71.

To obtain a favorable bonding state, it may be considered that the pressing force can be increased in the pressure treatment, and that the heating temperature or heating time can be increased in the heating treatment. This, however, can cause deformation of the channels 71 in the resulting microchip, making the formation of the channels 71 of desired configuration difficult.

The present invention has been made in view of the foregoing circumstances and has as its object the provision of a microchip that can achieve a favorable bonding state in the bonding portion between the first and second substrates even if the microchip is large in size.

Solution to Problem

A microchip according to the present invention is a microchip including a first substrate made of a resin and a second substrate made of a resin, the first substrate and the second substrates being bonded to each other, a channel surrounded by a bonding portion between the first substrate and the second substrate being formed by a channel forming step formed at least in the first substrate, wherein:

a noncontact portion is formed to surround the bonding portion; and an angle $\theta_1$ formed between a side wall surface of the channel forming step and a bonding surface continuous therewith satisfies $\theta_1>90°$.

In the foregoing microchip, an angle $\theta_2$ formed between a side wall surface of the noncontact portion and a bonding surface continuous therewith may preferably satisfy $\theta_2>90°$.

A microchip according to the present invention is a microchip including a first substrate made of a resin and a second substrate made of a resin, the first substrate and the second substrate being bonded to each other, a channel surrounded by a bonding portion between the first substrate and the second substrate being formed by a channel forming step formed at least in the first substrate, wherein:

a noncontact portion is formed to surround the bonding portion; and at least either a side wall surface of the channel forming step or a side wall surface of the noncontact portion is chamfered or rounded in an area near a bonding surface continuous with the side wall surface.

In the microchip according to the present invention, a bonding portion between the first substrate and the second substrate may preferably be formed at least on part of a periphery of the first substrate and the second substrate.

Advantageous Effects of Invention

According to the microchip of the present invention, a favorable bonding state can be achieved in the bonding portion between the first substrate and the second substrate even if the microchip is large in size. Since the pressing force, the heating temperature, or the heating time does not need to be increased in manufacturing the microchip, a channel of desired configuration can be reliably formed.

DESCRIPTION OF EMBODIMENTS

Embodiments of a microchip according to the present invention will be described below.

First Embodiment

Figure 1A:
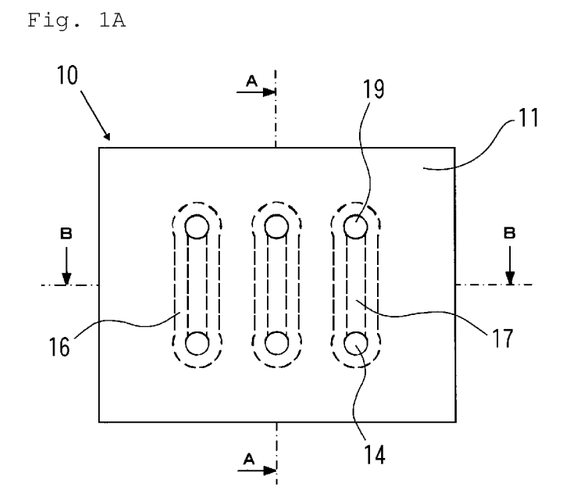
FIG. 1A is a plan view illustrating a configuration according to a first embodiment of a microchip of the present invention.
Figure 1B:
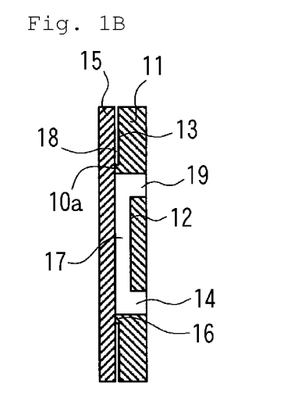
FIG. 1B is a cross-sectional end view taken along line A-A of FIG. 1A.
Figure 1C:
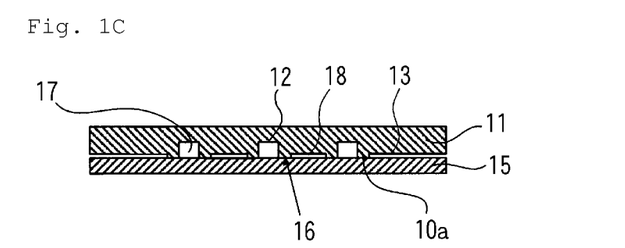
FIG. 1C is a cross-sectional end view taken along line B-B of FIG. 1A.

FIG. 1A is a plan view illustrating a configuration according to a first embodiment of the microchip of the present invention. FIG. 1B is a cross-sectional end view taken along line A-A of FIG. 1A. FIG. 1C is a cross-sectional end view taken along line B-B of FIG. 1A. This microchip 10 includes a plate-shape member formed by bonding a first substrate 11 made of a resin and a second substrate 15 made of a resin.

Channel forming steps 12 are formed in the front surface of the first substrate 11 on the side being in contact with the second substrate 15 (bottom surface in FIG. 1C). On the other hand, the front surface of the second substrate 15 on the side being in contact with the first substrate 11 (top surface in FIG. 1C) is configured as a flat surface. In the microchip 10, the channel forming steps 12 formed in the first substrate 11 form channels 17 surrounded by bonding portions 16 between the first substrate 11 and the second substrate 15. One end of each channel 17 is connected to an injection port 14 formed in the first substrate 11, and the other end of the channel 17 is connected to a discharge port 19 formed in the first substrate 11.

In addition, a noncontact portion step 13 is formed in the front surface of the first substrate 11 on the side being in contact with the second substrate 15 to surround the bonding portions 16. The noncontact portion step 13 forms a noncontact portion 18 surrounding the bonding portions 16 between the first substrate 11 and the second substrate 15.

Silicone resins, such as polydimethylsiloxane, cycloolefin resins and acrylic resins may be used as a resin constituting the first substrate 11 and the second substrate 15.

The thickness of each of the first substrate 11 and the second substrate 15 is not limited in particular. For example, the thickness is 0.5 to 7 mm.

The channels 17 have a width (in the illustrated example, the width of the channel forming steps 12) of 0.1 to 3 mm, for example.

The channels 17 have a height (in the illustrated example, the depth of the channel forming steps 12) of 0.05 to 1 mm, for example.

Figure 2:
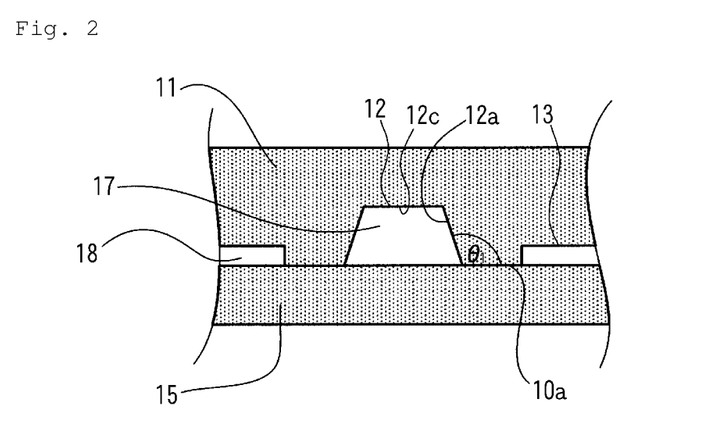
FIG. 2 is an explanatory cross-sectional view illustrating, in an enlarged manner, essential parts of the microchip illustrated in FIGS. 1A to 1C.

In the microchip 10 according to the present invention, as illustrated in an enlarged manner in FIG. 2, an angle $\theta_1$ formed between each of the side wall surfaces 12a of the channel forming steps 12 and the bonding surface 10a continuous therewith (hereinafter, referred to simply as an "angle $\theta_1$") satisfies $\theta_1>90°$, preferably $120°≥\theta_1>90°$, more preferably $100°≥\theta_1>90°$. If the angle $\theta_1$ is not more than $90°$, the first substrate 11 can fail to be released from a mold in manufacturing the first substrate 11 by injection molding. If the first substrate 11 is released from the mold by application of a large force in a direction of pulling the first substrate 11 and the mold apart, the vicinities of the continuous portions between the side wall surfaces 12a and the bonding surfaces 10a are deformed. This impairs the flatness of the bonding surfaces 10a and makes bonding over the entire bonding surfaces 10a difficult. Even if a combination of molds and the like can be contrived to mold the first substrate 11 configured to have an angle $\theta_1$ of not more than 90°, sufficient pressure cannot be applied to the bonding surfaces 10a during the pressure treatment since the bonding surfaces 10a are unable to be pressed from directly above. This causes problems such as a drop in bonding strength. On the other hand, if the angle $\theta_1$ is too large, bottom portions 12c of the channel forming steps 12 (top surface of the channel 17 in FIG. 2) decrease in area. Since the proportion of the side wall surfaces 12a that are slopes in the channels 17 increase, variations occur due to the velocity distribution of the circulated specimen, differences in reaction speed, etc. This makes impossible a predetermined action such as a biochemical reaction of the specimen to be caused in the channels 17. If optical observation under an optical microscope is performed, the side wall surfaces 12a are difficult to observe because of refraction. Since the observable regions are only the bottom portions 12c of reduced area, there also arise problems such as that accurate observation is not possible.

When the microchip 10 is seen in a plan view, the area $S_1$ of the microchip 10 and the area $S_2$ of the bonding surfaces 10a may preferably satisfy $S_2/S_1<0.5$, more preferably $0.03<S_2/S_1<0.3$. If the value of the $S_2/S_1$ is not smaller than 0.5, the large bonding area makes absorption of warps and undulations difficult. To obtain a favorable bonding state with a large bonding area, the pressing force needs to be increased in the pressure treatment or the heating temperature needs to be increased in a heating treatment. As a result, the channels 17 are deformed. On the other hand, if the value of $S_2/S_1$ is too small, the bonding surfaces 10a themselves are small and thus the first substrate 11 and the second substrate 15 bonded by mechanical stress become more likely to exfoliate. In addition, application of a small load may increase the pressure at the bonding surfaces 10a, whereby the bonding portions 16 may be crushed or cracked.

The bonding surfaces 10a between the channels 17 and the noncontact portion 18 may preferably have a width of not less than 50 μm, more preferably 500 to 2000 μm. If the width of the bonding surfaces 10a is less than 50 μm, the bonding surfaces 10a themselves are small and thus the first substrate 11 and the second substrate 15 bonded by mechanical stress become more likely to exfoliate. In addition, application of a small load can increase the pressure at the bonding surfaces 10a, whereby the bonding portions 16 can be crushed or cracked.

The foregoing microchip 10 can be manufactured, for example, in the following manner.

Figure 3:
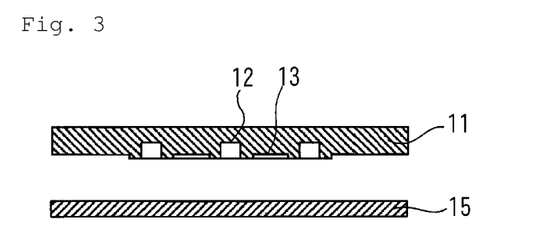
FIG. 3 is an explanatory cross-sectional view illustrating a first substrate and a second substrate before bonding.

Initially, as illustrated in FIG. 3, the first substrate 11 and the second substrate 15 each made of a resin are manufactured. The channel forming steps 12 and the noncontact portion step 13 are formed in the front surface of the first substrate 11. On the other hand, the second substrate 15 is a flat front surface.

As a method for manufacturing the first substrate 11 and the second substrate 15, resin molding methods such as injection molding and casting can be selected as appropriate depending on the resin to be used.

Next, a surface activation treatment is performed on the front surfaces of the respective first and second substrates 11 and 15 to be bonding surfaces. For the surface activation treatment, an ultraviolet irradiation treatment of irradiating the front surfaces with vacuum ultraviolet rays having a wavelength of not more than 200 nm or a plasma treatment of bringing the front surfaces into contact with atmospheric pressure plasma from an atmospheric pressure plasma device can be used.

If the ultraviolet irradiation treatment is used as the surface activation treatment, an excimer lamp, such as a xenon excimer lamp having a bright line at a wavelength of 172 nm, a low-pressure mercury lamp having a center wavelength of 185 nm and a heavy hydrogen lamp having strong emission spectra within a range of 120 to 200 nm in wavelength can be suitably used as a light source for emitting vacuum ultraviolet rays.

The vacuum ultraviolet rays with which the front surfaces of the respective first and second substrates 11 and 15 are irradiated have an irradiance of 10 to 500 mW/cm$^2$, for example.

The irradiation time of the front surfaces of the respective first and second substrates 11 and 15 with the vacuum ultraviolet rays are set as appropriate depending on the resin constituting the first substrate 11 and the second substrate 15. Examples include 5 to 6 seconds.

If the plasma treatment is used as the surface activation treatment, a plasma generation gas mainly containing nitrogen gas, argon gas, or the like containing 0.01 to 5 vol. % of oxygen gas is suitably used. Alternatively, a mixed gas of nitrogen gas and clean dry air (CDA) can be used.

The operation condition of the atmospheric pressure plasma device used in the plasma treatment includes, for example, a frequency of 20 to 70 kHz, a voltage of 5 to 15 kVp-p and a power value of 0.5 to 2 kW.

The processing time in the atmospheric pressure plasma is 5 to 100 seconds, for example.

The first substrate 11 and the second substrate 15 thus given the surface activation treatment are stacked so that their front surfaces are in contact with each other. The first substrate 11 and the second substrate 15 are then bonded by being pressed in a thickness direction by their own weights or by application of pressure from outside and, if needed, with application of heat.

Specific conditions of the foregoing pressurization and heating are set as appropriate depending on the material constituting the first substrate 11 and the second substrate 15.

Examples of the specific conditions include a pressing force of 0.1 to 10 MPa and a heating temperature of 40° C. to 130° C.

In the foregoing microchip 10, the noncontact portion 18 is formed to surround the bonding portions 16 formed around the channels 17, and the angle $\theta_1$ satisfies $\theta_1>90°$. In bonding the first substrate 11 and the second substrate 15, pressure is thus concentrated on the portions of the first substrate 11 and the second substrate 15 to be the bonding portions 16. As a result, even if the first substrate 11 and the second substrate 15 are warped, their front surfaces to be the bonding surfaces are bonded in a fully close-contact state.

According to the microchip 10 of the present invention, a favorable bonding state can thus be achieved in the bonding portions 16 between the first substrate 11 and the second substrate 15 even if the microchip 10 is large in size. Since the pressing force, the heating temperature, or the heating time does not need to be increased in manufacturing the microchip 10, the channels 17 of desired configuration can be reliably formed.

Figure 4:
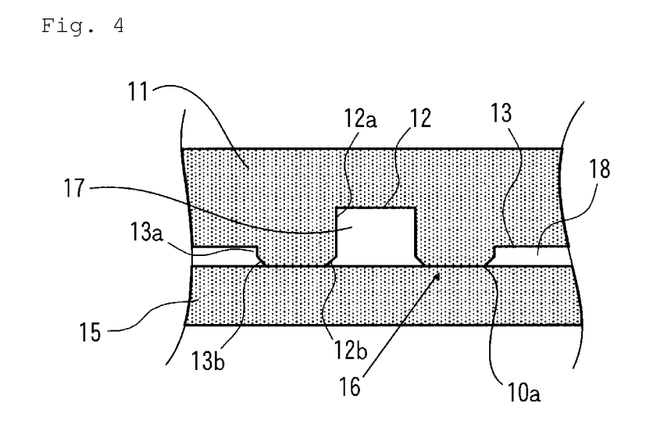
FIG. 4 is an explanatory diagram illustrating a configuration according to a second embodiment of the microchip of the present invention.

FIG. 4 is an explanatory cross-sectional view illustrating a configuration of essential parts according to a second embodiment of the microchip of the present invention. This microchip 10 has the same configuration as that of the microchip 10 according to the first embodiment except the following aspects:

In the microchip illustrated in FIG. 4, the side wall surfaces 12a of the channel forming steps 12 and the side wall surfaces 13a of the noncontact portion 18 are chamfered in areas (hereinafter, also referred to as "bonding portion neighboring areas") 12b and 13b near the bonding surfaces 10a continuous with the respective side wall surfaces 12a and 13a.

The angle $\theta_1$ is within a range of $140° \geq \theta_1 \geq 90°$, for example.

In the foregoing microchip 10, the noncontact portion 18 is formed to surround the bonding portions 16 formed around the channels 17, and the side wall surfaces 12a of the channel forming steps 12 and the side wall surfaces 13a of the noncontact portion 18 are chamfered in the respective bonding portion neighboring areas 12b and 13b. In bonding the first substrate 11 and the second substrate 15, pressure is thus concentrated on the portions of the first substrate 11 and the second substrate 15 to be the bonding portions 16. As a result, even if the first substrate 11 and the second substrate 15 are warped, their front surfaces to be the bonding surfaces can be bonded in a fully close-contact state.

According to the microchip 10 of the present invention, a favorable bonding state can be achieved in the bonding portions 16 between the first substrate 11 and the second substrate 15 even if the microchip 10 is large in size. In addition, since the pressing force, the heating temperature, or the heating time does not need to be increased in manufacturing the microchip 10, the channels 17 of desired configuration can be reliably formed.

Figure 5:
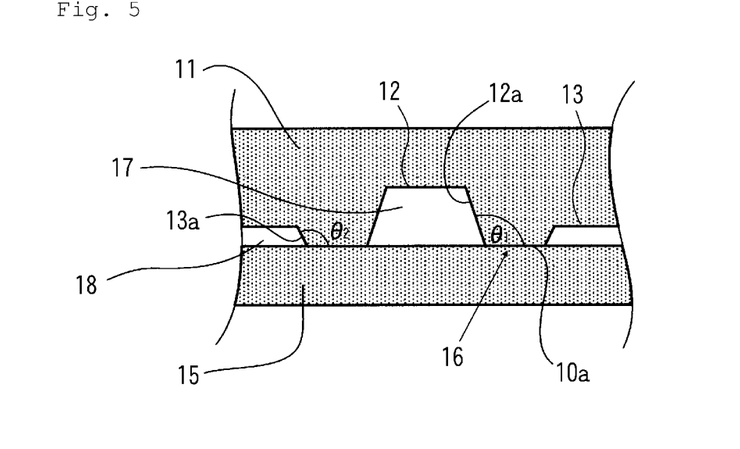
FIG. 5 is an explanatory cross-sectional view illustrating, in an enlarged manner, essential parts of a modification of the microchip according to the first embodiment.

While the first embodiment and the second embodiment according to the microchip of the present invention have been described above, the present invention is not limited to such embodiments, and various modifications can be made as follows:

(1) In the first embodiment, as illustrated in FIG. 5, an angle $\theta_2$ formed between each of the side wall surfaces 13a of the noncontact portion 18 and the bonding surface 10a continuous therewith (hereinafter, referred to simply as an "angle $\theta_2$") may preferably satisfy $\theta_2 > 90°$, more preferably $150° \geq \theta_2 > 90°$, yet more preferably $120° \geq \theta_2 > 90°$.

According to such a microchip 10, in bonding the first substrate 11 and the second substrate 15, pressure is even more concentrated on the portions of the first substrate 11 and the second substrate 15 to be the bonding portions 16. A favorable bonding state can thus be more reliably achieved in the bonding portions 16 between the first substrate 11 and the second substrate 15 even if the microchip 10 is large in size.

Figure 6:
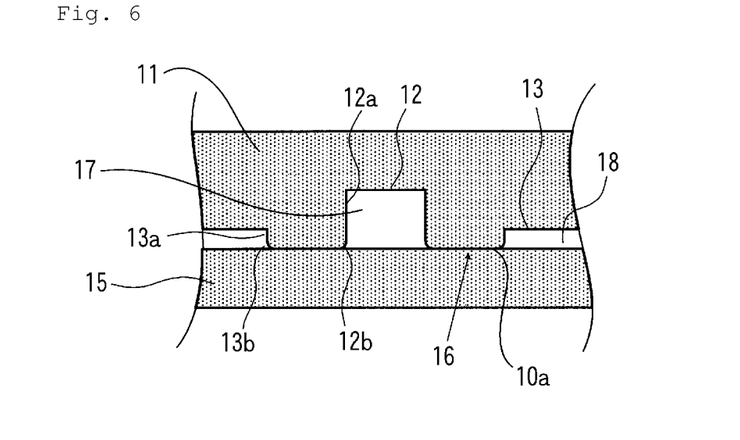
FIG. 6 is an explanatory cross-sectional view illustrating, in an enlarged manner, essential parts of a modification of the microchip according to the second embodiment.

(2) In the second embodiment, as illustrated in FIG. 6, the side wall surfaces 12a of the channel forming steps 12 and the side wall surfaces 13a of the noncontact portion 18 may be rounded in the respective bonding portion neighboring areas 12b and 13b instead of being chamfered.

(3) In the microchips 10 illustrated in FIGS. 4 and 6, either the side wall surfaces 12a of the channel forming steps 12 or the side wall surfaces 13a of the noncontact portion 18 may be chamfered or rounded in the bonding portion neighboring areas 12b or the bonding portion neighboring areas 13b.

Figure 7:
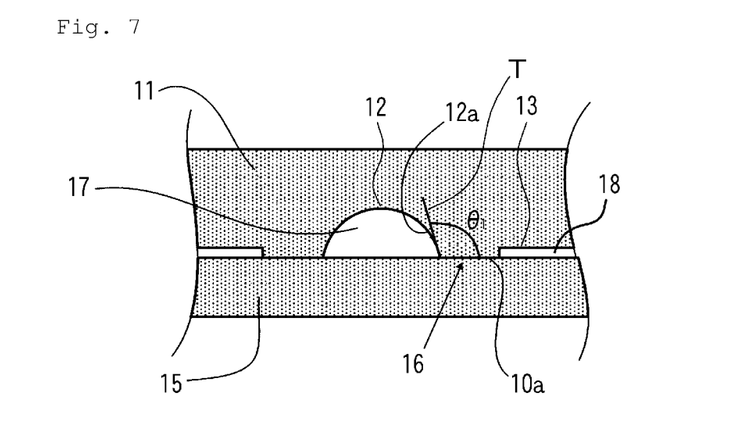
FIG. 7 is an explanatory cross-sectional view illustrating, in an enlarged manner, essential parts of another modification of the microchip according to the first embodiment.

(4) In the first embodiment, the bottom surface and the side wall surfaces 12a of a channel forming step 12 are configured as a flat surface each. However, as illustrated in FIG. 7, the bottom surface and the side wall surfaces 12a may be configured as a continuous curved surface. In such a configuration, the angle $\theta_1$ refers to an angle formed between the tangent T to the side wall surface 12a of the channel forming step 12 at the intersection of the side wall surface 12a and the bonding surface 10a and the bonding surface 10a in a section perpendicular to the extending direction of the channel 17.

Figure 8A:
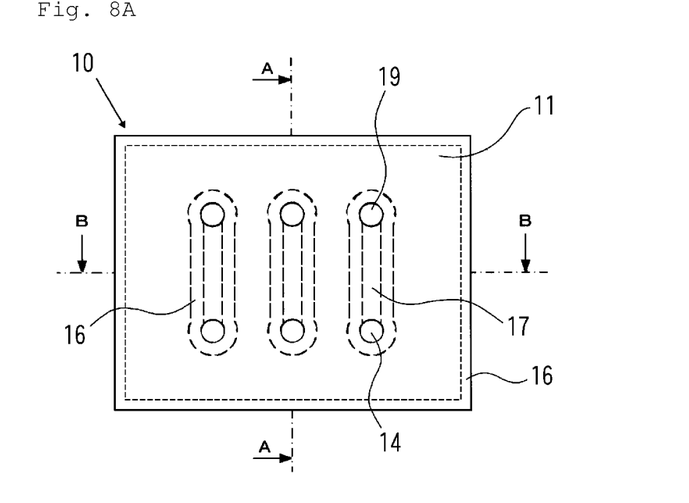
FIG. 8A is a plan view illustrating a configuration according to another embodiment of the microchip of the present invention.
Figure 8B:
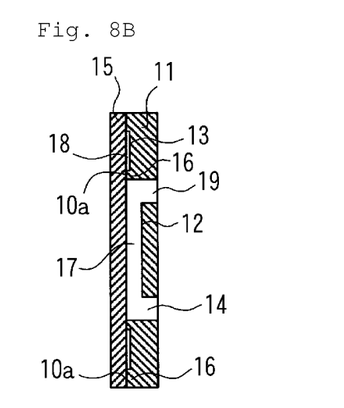
FIG. 8B is a cross-sectional end view taken along line A-A of FIG. 8A.
Figure 8C:
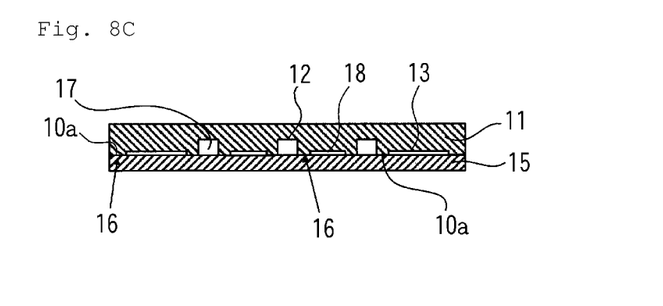
FIG. 8C is a cross-sectional end view taken along line B-B of FIG. 8A.

(5) According to the microchip 10 of the present invention, as illustrated in FIGS. 8A to 8C, a bonding portion 16 between the first substrate 11 and the second substrate 15 may be formed at least on part of the periphery of the first substrate 11 and the second substrate 15 (in the illustrated example, the entire periphery).

In such a configuration, the bonding surface 10a formed on the periphery of the first substrate 11 and the second substrate 15 may preferably have a width of not less than 50 µm, more preferably 500 to 3000 µm. The bonding surface 10a formed on the foregoing periphery is desirably bonded over a width greater than that of the bonding surfaces 10a between the channels 17 and the noncontact portion 18. According to such a configuration, the microchip 10 is more tolerable against mechanical stress acting in a direction in which the first substrate 11 and the second substrate 15 exfoliate.

The area $S_2$ of the bonding surfaces 10a refers to a total of the areas of the bonding surfaces 10a between the channels 17 and the noncontact portion 18 and the area of the bonding surface 10a formed on the periphery of the first substrate 11 and the second substrate 15.

Figure 9:
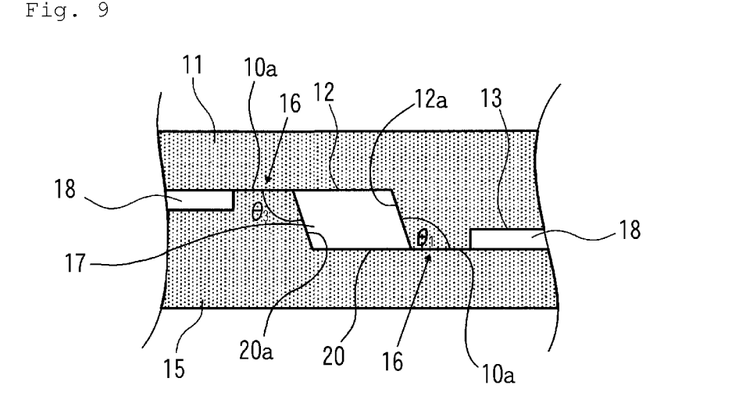
FIG. 9 is an explanatory cross-sectional view illustrating, in an enlarged manner, essential parts of yet another modification of the microchip according to the first embodiment.

(6) In the first embodiment, as illustrated in FIG. 9, a channel 17 maybe formed by a channel forming step 12 formed in the first substrate 11 and a channel forming step 20 formed in the second substrate 15.

In such a configuration, like the angle $\theta_1$, an angle $\theta_3$ formed between a side wall surface 20a of the channel forming step 20 in the second substrate 15 and the bonding surface 10a continuous therewith satisfies $\theta_3 > 90°$, preferably $120° \geq \theta_3 > 90°$, more preferably $100° \geq \theta_3 > 90°$.

(7) Each of the microchips 10 illustrated in FIGS. 1 to 9 is an example where the noncontact portion 18 is formed separately from the channels 17. However, the microchip according to the present invention may be configured so that the noncontact portion also serves as a channel.

REFERENCE SIGNS LIST 10 microchip
10a bonding surface
11 first substrate
12 channel forming step
12a side wall surface
12b bonding portion neighboring area
12c bottom portion
13 noncontact portion step
13a side wall surface
13b bonding portion neighboring area
14 injection port
15 second substrate
16 bonding portion
17 channel
18 noncontact portion
19 discharge port
20 channel forming step
20a side wall surface
70 first substrate
71 channel
72 injection port 73 discharge port
74 channel forming step
75 second substrate

The invention claimed is:

1. A microchip comprising a first substrate made of a resin and a second substrate made of a resin, the first substrate and the second substrates being bonded to each other, a channel surrounded by a bonding portion between the first substrate and the second substrate being formed by a channel forming step formed at least in the first substrate, wherein:
 a noncontact portion is formed to surround the bonding portion around an entire circumference of the bonding portion and the channel;
 an angle $\theta_1$ formed between a side wall surface of the channel forming step and a bonding surface continuous therewith satisfies $\theta_1 > 90°$;
 a bonding surface and the front surface of the second substrate on the side being in contact with the first substrate is configured as a flat surface; and
 the bonding surface has a width of not less than 500 μm.

2. The microchip according to claim 1, wherein an angle $\theta_2$ formed between a side wall surface of the noncontact portion and a bonding surface continuous therewith satisfies $\theta_2 > 90°$.

3. A microchip comprising a first substrate made of a resin and a second substrate made of a resin, the first substrate and the second substrate being bonded to each other, a channel surrounded by a bonding portion between the first substrate and the second substrate being formed by a channel forming step formed at least in the first substrate, wherein:
 a noncontact portion is formed to surround the bonding portion around an entire circumference of the bonding portion and the channel;
 at least either a side wall surface of the channel forming step or a side wall surface of the noncontact portion is chamfered or rounded in an area near a bonding surface continuous with the side wall surface;
 a bonding surface and the front surface of the second substrate on the side being in contact with the first substrate is configured as a flat surface; and
 the bonding surface has a width of not less than 500 μm.

4. The microchip according to claim 1, wherein a bonding portion between the first substrate and the second substrate is formed at least on part of a periphery of the first substrate and the second substrate.

* * * * *